United States Patent
Juan et al.

(10) Patent No.: US 12,353,326 B1
(45) Date of Patent: Jul. 8, 2025

(54) CONTROL METHOD FOR READING OPERATION OF MEMORY DEVICE

(71) Applicant: MACRONIX INTERNATIONAL CO., LTD., Hsinchu (TW)

(72) Inventors: Shih-Chou Juan, Taoyuan (TW); Shun-Li Cheng, Zhubei (TW); Hung-Yi Chiang, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 18/640,310

(22) Filed: Apr. 19, 2024

(51) Int. Cl.
 G06F 12/02 (2006.01)
 G06F 13/16 (2006.01)
 G06F 13/42 (2006.01)
 G11C 16/32 (2006.01)

(52) U.S. Cl.
 CPC ...... *G06F 12/0246* (2013.01); *G06F 13/1689* (2013.01); *G06F 13/4239* (2013.01); *G11C 16/32* (2013.01)

(58) Field of Classification Search
 None
 See application file for complete search history.

(56) References Cited

U.S. PATENT DOCUMENTS

| | | | | |
|---|---|---|---|---|
| 12,197,749 B2* | 1/2025 | Cheng | | G06F 3/0625 |
| 2005/0024960 A1* | 2/2005 | Krishnan | | G11C 29/027 |
| | | | | 365/201 |
| 2010/0312981 A1* | 12/2010 | Kajimura | | G06F 13/1689 |
| | | | | 713/400 |
| 2016/0034189 A1* | 2/2016 | Kim | | G06F 3/061 |
| | | | | 711/103 |
| 2019/0317683 A1* | 10/2019 | Mayer | | G11C 29/023 |
| 2021/0064294 A1* | 3/2021 | Kim | | G06F 3/0679 |
| 2021/0151085 A1* | 5/2021 | Kim | | G11C 7/1051 |

* cited by examiner

*Primary Examiner* — Nathan Sadler
(74) *Attorney, Agent, or Firm* — McClure, Qualey & Rodack, LLP

(57) ABSTRACT

A control method, for controlling a reading operation of a memory device, includes the following steps. A toggle signal is provided to the memory device, and the toggle signal has a toggle frequency. A reading operation of a page of the memory device is performed according to the toggle signal, wherein the page includes a plurality of chunks. The toggle frequency is set as a target toggle frequency, and the reading operation of a first chunk of the page is performed according to the target toggle frequency, so as to receive a data signal of the memory device. After the reading operation of the first chunk is completed, the toggle frequency is selectively adjusted to perform the reading operation of a second chunk after the first chunk according to a stable state of the data signal and the data strobe signal.

20 Claims, 8 Drawing Sheets

CONTROL METHOD FOR READING OPERATION OF MEMORY DEVICE

TECHNICAL FIELD

The present disclosure relates to a control method, and more particularly, relates to a control method for controlling a reading operation of a memory device.

BACKGROUND

With the evolution of technology of manufacturing process of semiconductor, pages of a NAND flash memory device can achieve a larger data amount. During the reading operation of the NAND flash memory device, the memory device controller must provide a toggle signal to the NAND flash memory device as a reference signal. The supplier of the NAND flash memory device has formulated operating specifications, which stipulate that the memory device controller must continuously provide the toggle signal to the NAND flash memory device, until a complete reading operation of a page is completed.

In an early stage of the reading operation of the page, a read waveform of the data signal is unstable since the data signal has a preamble. Furthermore, during an intermediate procedure of the reading operation of the page, the memory device controller may need to perform internal operations, thereby temporarily stopping the reading operation and temporarily stopping to provide the toggle signal. This means that after the reading operation of a chunk in the page is completed, the memory device controller must wait for a long stop-period before the reading operation of the next chunk, which will greatly reduce the reading efficiency.

In view of the above issues, an improved control method is needed, so as to well control the reading operation of the memory device (e.g., an NAND flash memory device) to ensure the memory device to operate normally and enhance the read efficiency.

SUMMARY

According to one embodiment of the present disclosure, a control method is provided for controlling a reading operation of a memory device. The control method includes the following steps. A toggle signal is provided to the memory device, and the toggle signal has a toggle frequency. A reading operation of a page of the memory device is performed according to the toggle signal, wherein the page includes a plurality of chunks. The toggle frequency is set as a target toggle frequency, and the reading operation of a first chunk of the page is performed according to the target toggle frequency, so as to receive a data signal of the memory device. After the reading operation of the first chunk is completed, the toggle frequency is selectively adjusted to perform the reading operation of a second chunk after the first chunk according to a stable state of the data signal and the data strobe signal.

According to another embodiment of the present disclosure, a control method is provided for controlling a reading operation of a memory device. The control method includes the following steps. Providing a toggle signal to the memory device, the toggle signal has a toggle frequency. Performing a reading operation of a page of the memory device according to the toggle signal, wherein the page includes a plurality of chunks. Setting the toggle frequency as a target toggle frequency, and performing a reading operation of a first chunk of the page according to the target toggle frequency, so as to receive a data signal from the memory device. After the reading operation of the first chunk is completed, analyzing a latch margin of the data strobe signal with respect to the data signal according to a time difference between at least one check-point and a rising edge of the data strobe signal. Determining a stable state of the data signal and the data strobe signal according to the latch margin. Selectively adjusting the toggle frequency according to the stable state of the data signal and the data strobe signal. Performing a reading operation of a second chunk after the first chunk according to the toggle frequency which is adjusted.

According to still another embodiment of the present disclosure, a control method is provided for controlling a reading operation of a memory device. The control method includes the following steps. Providing a toggle signal to the memory device, the toggle signal has a toggle frequency. Performing a reading operation of a page of the memory device according to the toggle signal, wherein the page includes a plurality of chunks. Setting the toggle frequency as a target toggle frequency, and performing a reading operation of a first chunk of the page according to the target toggle frequency, so as to receive a data signal from the memory device. After the reading operation of the first chunk is completed, selectively stopping providing the toggle signal to the memory device and analyzing a latch margin of the data strobe signal with respect to the data signal. Selectively adjusting the toggle frequency according to the latch margin. Performing a reading operation of a second chunk after the first chunk according to the toggle frequency which is adjusted.

Figure 1:
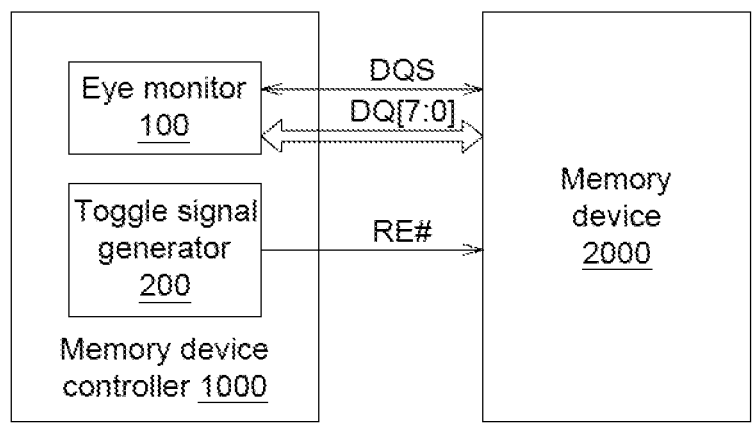
FIG. 1 is a block diagram of a memory device controller and a memory device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which is a block diagram of a memory device controller 1000 and a memory device 2000 according to an embodiment of the present disclosure. The memory device 2000 is, e.g., a NAND flash memory device. The memory device controller 1000 is implemented as a hardware circuit, such as an application specific integrated circuit (ASIC). The memory device controller 1000 is electrically coupled to the memory device 2000. The memory device controller 1000 is used to control various operations of the memory device 2000, such as reading operations.

In the reading operation, the memory device 2000 transmits a data signal DQ to the memory device controller 1000. The data signal DQ includes, e.g., 8 bits (which may be expressed as "DQ[7:0]"). Furthermore, the memory in device controller 1000 and the memory device 2000 may bi-directionally transmit a data strobe signal (DQS), and the memory device controller 1000 performs a latching on the data signal DQ according to the data strobe signal DQS. Furthermore, the memory device controller 1000 transmits a toggle signal RE to the memory device 2000, and the memory device controller 1000 controls a reading rate of the data signal DQ according to the toggle signal RE.

More specifically, the memory device controller 1000 includes an eye monitor 100 and a toggle signal generator 200. The eye monitor 100 receives and monitors the data signal DQ and the data strobe signal DQS, thereby analyzing a latch margin of the data strobe signal DQS with respect to the data signal DQ. Furthermore, the toggle signal generator 200 generates a toggle signal RE. The toggle signal RE has a toggle frequency F, and the toggle frequency F is proportional to the reading rate of the data signal DQ.

Based on the latch margin of the data strobe signal DQS with respect to the data signal DQ analyzed by the eye monitor 100, the toggle signal generator 200 may adjust the toggle frequency F of the toggle signal RE, thereby adjusting the reading rate of the data signal DQ.

Figure 2A:
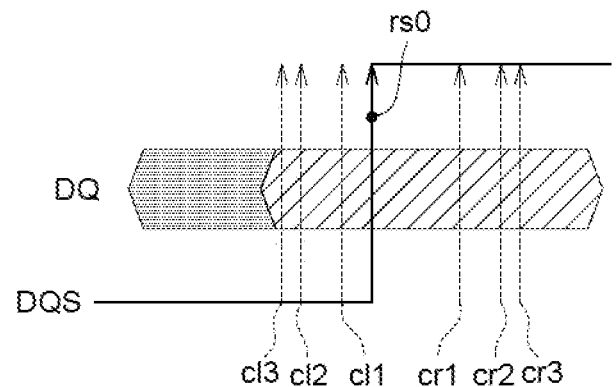
FIGS. 2A-2C are schematic diagrams illustrating the eye monitor 100 analyzes the latch margin of the data strobe signal with respect to the data signal.
Figure 2B:
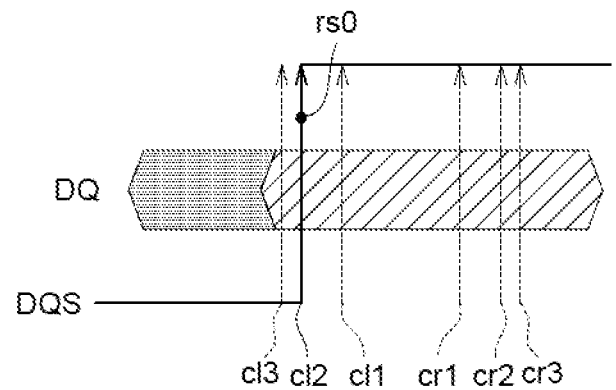
Figure 2C:
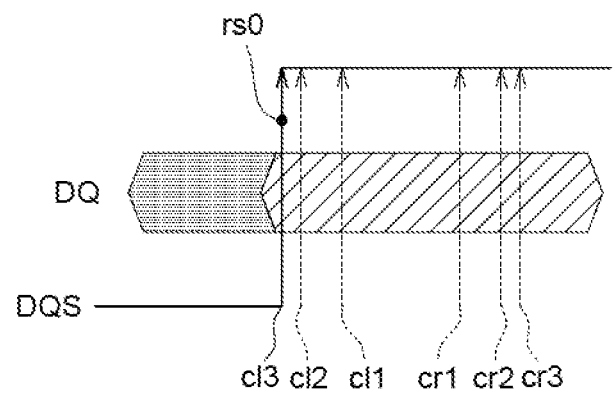

FIGS. 2A-2C are schematic diagrams illustrating the eye monitor 100 analyzes the latch margin of the data strobe signal DQS with respect to the data signal DQ. Firstly, please refer to FIG. 2A, the eye monitor 100 sets several check-points, including, e.g., three left check-points cl1, cl2 and cl3 and three right check-points cr1, cr2 and cr3. The eye monitor 100 analyzes the latch margin of the data strobe signal DQS with respect to the data signal DQ based on relationships (e.g., relative locations) of these left check-points cl1, cl2, and cl3 and right check-points cr1, cr2, and cr3 and the rising edge rs0 of the data strobe signal DQS. Then, the eye monitor 100 analyzes a stable state of the data signal DQ and the data strobe signal DQS. For example, the left check-points cl1, cl2 and cl3 and the right check-points cr1, cr2 and cr3 may be disposed far or near the rising edge rs0, and the latch margin may be analyzed based on a time difference between the rising edge rs0 and at least one of the left check-points cl1, cl2 and cl3 (or the right check-points cr1, cr2 and cr3). The mentioned "time difference" may refer to "distance" along a time axis, between the rising edge rs0 and the left check-points cl1, cl2 and cl3 (or the right check-points cr1, cr2 and cr3) When the left check-points cl1, cl2 and cl3 (or the right check-points cr1, cr2 and cr3) are located near the rising edge rs0 and hence have shorter "distance" from the rising edge rs on the time axis, they have less "time difference" there-between.

The left check-points cl1, cl2 and cl3 are used to check whether a setup time of the data signal DQ with respect to the rising edge rs0 of the data strobe signal DQS is sufficient. For example: the setup time should be greater than or equal to 0.25 ns. The leftmost left check-point cl3 may be set as a boundary, and the left check-point cl3 of the boundary is used to ensure that the setup time is sufficient.

On the other hand, the right check-points cr1, cr2 and cr3 are used to check whether a hold time of the data signal DQ with respect to the rising edge rs0 of the data strobe signal DQS is sufficient. The rightmost right check-point cr3 may be set as a boundary, and the right check-point cr3 of the boundary is used to ensure that the hold time is sufficient.

In the example of FIG. 2A, the rising edge rs0 of the data strobe signal DQS is located between the left check-point cl3 of the boundary and the right check-point cr3 of the boundary. Then, it is analyzed that the latch margin of the data strobe signal DQS with respect to the data signal DQ is sufficient (i.e., both the setup time and hold time of the data signal DQ with respect to the rising edge rs0 are sufficient), and it may be determined that the data signal DQ and the data strobe signal DQS are in a stable state. Therefore, the toggle signal generator 200 may increase the toggle frequency F of the toggle signal RE, thereby increasing the reading rate of the data signal DQ. For example, the toggle signal generator 200 may increase the toggle frequency F according to an incremental amount $\Delta F1$.

On the other hand, in the example of FIG. 2B, the rising edge rs0 of the data strobe signal DQS has a less distance from the left check-point cl3 of the boundary (the rising edge rs0 is substantially located at the left check-point cl2), indicating that the latch margin of the data strobe signal DQS with respect to the data signal DQ is less, but the latch margin is still sufficient. Therefore, the toggle signal generator 200 may still increase the toggle frequency F of the toggle signal RE, for example, increasing the toggle frequency F according to an incremental amount $\Delta F2$. Since the distance between the rising edge rs0 and the left check-point cl3 of the boundary is less, the incremental amount $\Delta F2$ of the toggle frequency F should be less than the incremental amount $\Delta F1$ of the example in FIG. 2A.

Furthermore, in the example of FIG. 2C, the rising edge rs0 of the data strobe signal DQS is substantially located at the left check-point cl3 of the boundary, indicating that the latch margin of the data strobe signal DQS with respect to the data signal DQ may not be sufficient. Therefore, the toggle signal generator 200 no longer increases the toggle frequency F of the toggle signal RE (i.e., the toggle frequency F remains unchanged).

Figure 3:
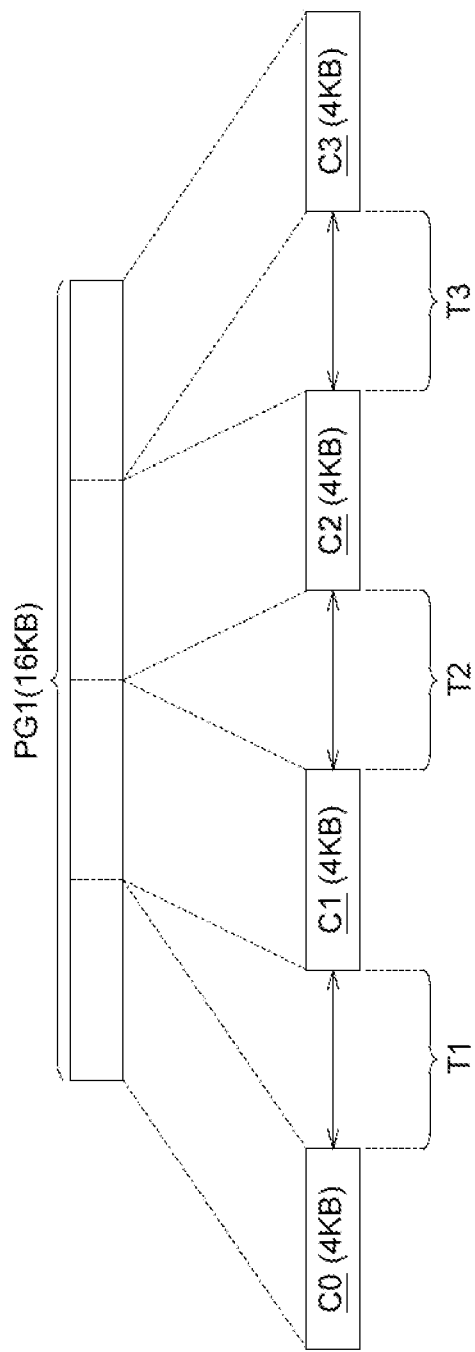
FIG. 3 is a schematic diagram illustrating the reading operation of a page of the memory device.

Please refer to FIG. 3, which is a schematic diagram illustrating the reading operation of a page of the memory device 2000. A page of the memory device 2000 may include, e.g., four chunks, and reading operation is performed based on these chunks. Taking a page PG1 in the memory device 2000 as an example, the page PG1 includes chunk C0, chunk C1, chunk C2 and chunk C3. The data amount of the page PG1 is, e.g., 16 KB, and the data amount of each of chunks C0-C3 is, e.g., 4 KB.

When the reading operation of the chunk C0 is completed (the chunk C0 may be referred to as "the first chunk"), if the memory device controller 1000 must perform other internal operations (e.g., error correction, "garbage collection", etc.), the memory device controller 1000 may temporarily stop the reading operation. During a stop-period T1 of the reading operation, the toggle signal generator 200 stops providing the toggle signal RE. After the stop-period T1, the reading operation of the next chunk C1 is started, and the toggle signal generator 200 resumes providing the toggle signal RE.

In one example, the memory device controller 1000 may set the stop-period T1 as a predefined period meet the specifications of the memory device 2000 (e.g., 1 µs), hence, the stop-period T1 is longer. After the stop-period T1, the data signal DQ and the data strobe signal DQS of the memory device 2000 are already in the stable state. Therefore, the reading operation of the next chunk C1 may be executed based on the toggle signal RE with a higher toggle frequency F_H (e.g., 800 MHz).

In another example, the memory device controller 1000 may set the stop-period T1 as being shorter than the predefined period specified by the memory device 2000. Since the stop-period T1 is shorter, the data signal DQ and the data strobe signal DQS may not be in the stable state at the early stage of the reading operation of the next chunk C1. Therefore, in the early stage of the reading operation of chunk C1, the reading operation is performed based on the toggle signal RE with a lower toggle frequency F_L (e.g., 400 MHz). Then, the toggle frequency F is gradually increased according to the stable state of the data signal DQ and the data strobe signal DQS.

Similarly, after the reading operation of chunk C1 is completed, the toggle signal RE is stopped during the stop-period T2. If the stop-period T2 is longer, the reading operation of the next chunk C2 may be performed based on the toggle signal RE with a higher toggle frequency F_H. If the stop-period T2 is shorter than the predefined period specified by the memory device 2000, at an early stage of the reading operation of the next chunk C2, the reading operation is performed based on the toggle signal RE with a lower toggle frequency F_L. Then, the toggle frequency F is gradually increased. The stop-period T3 after the completion of the reading operation of chunk C2 (before the starting of the reading operation of the next chunk C3) may be set based on the same mechanism.

Figure 4A:
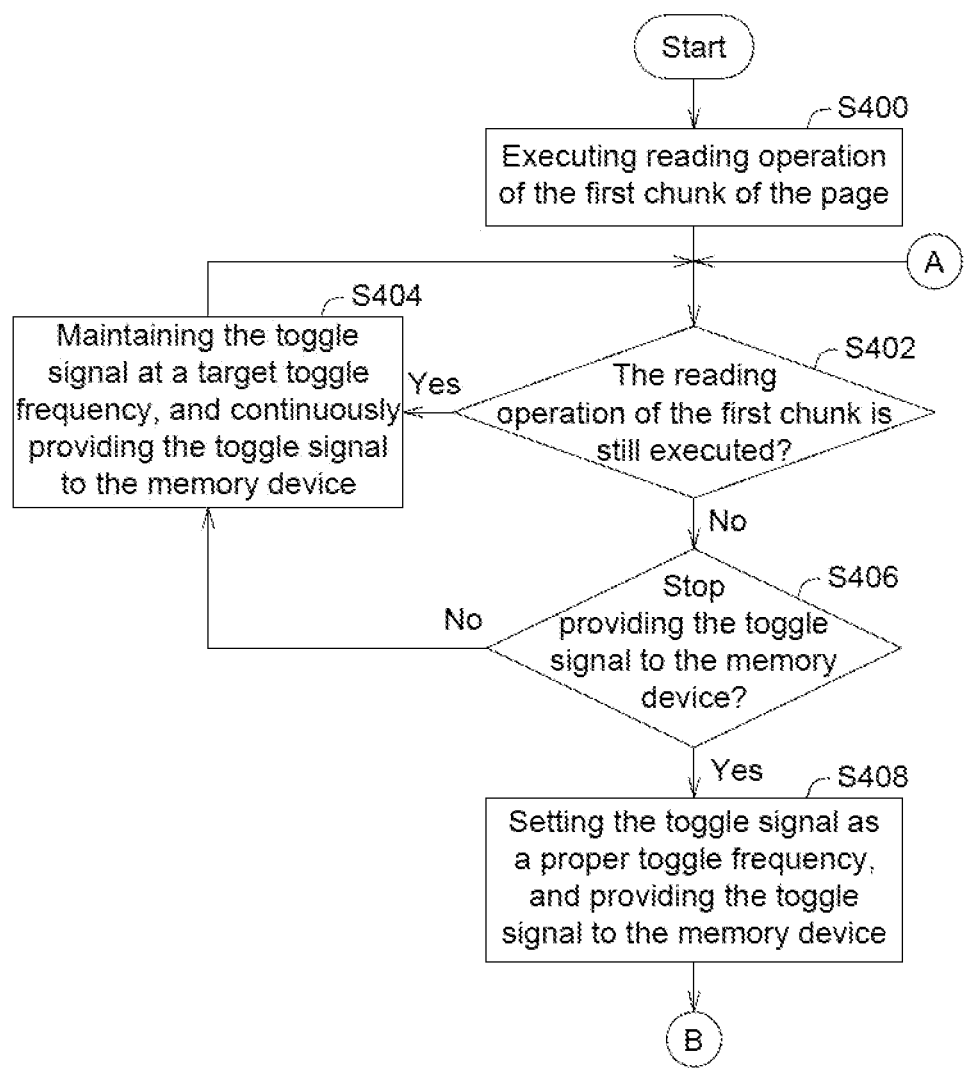
FIGS. 4A and 4B are flow diagrams of the control method for the reading operation of the memory device according to an embodiment of the present disclosure.
Figure 4B:
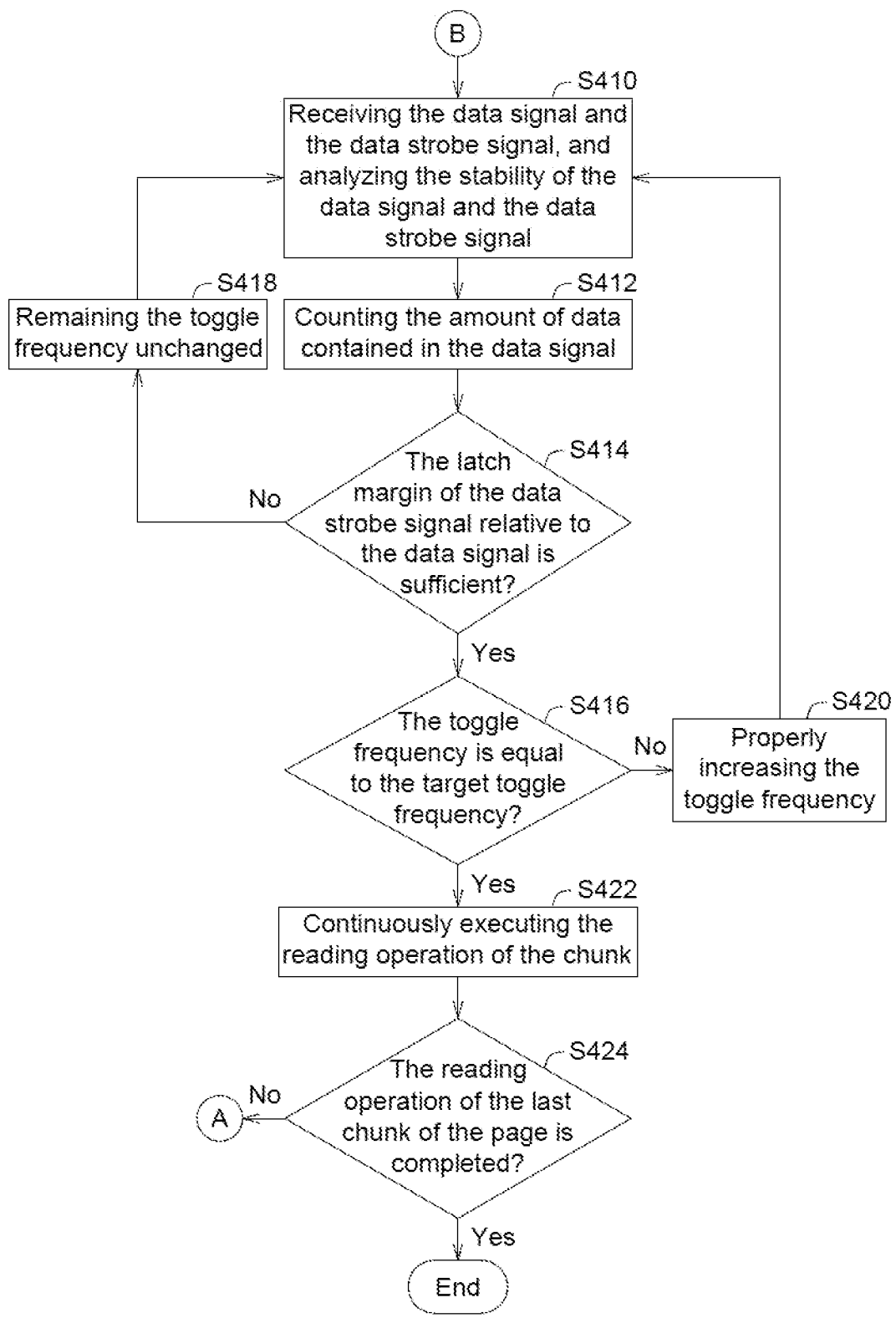
Figure 5:
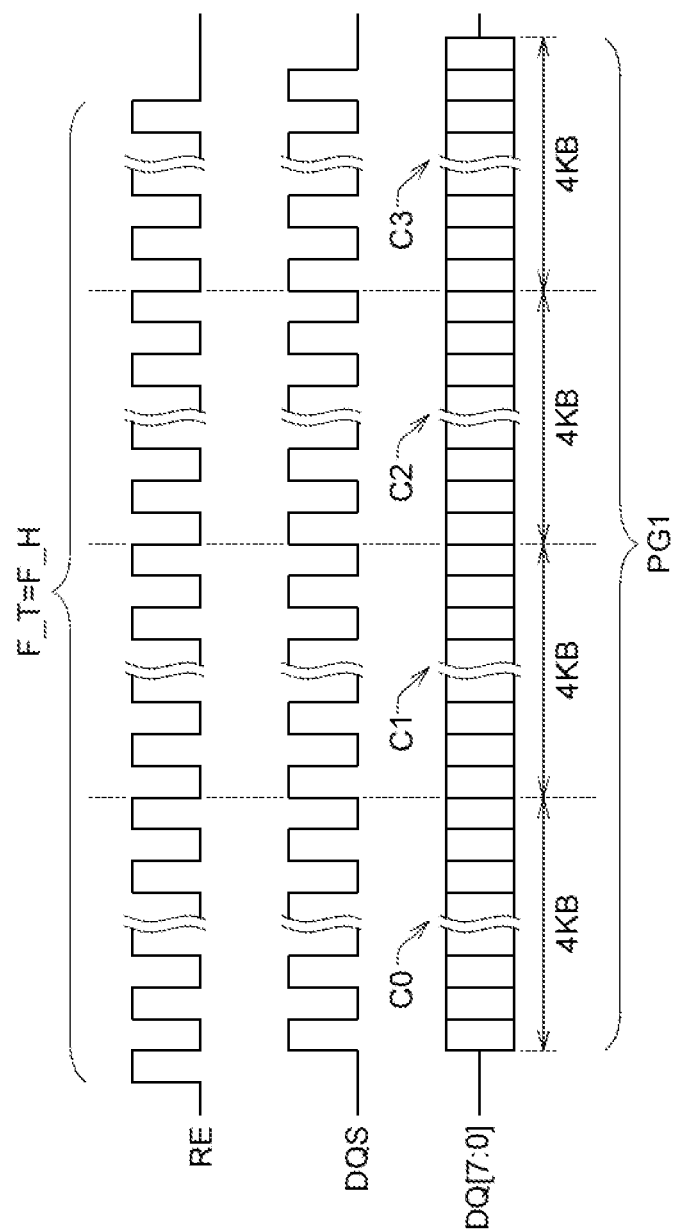
FIGS. 5 and 6 are schematic diagrams of the reading operation of a page, which is performed according to the method shown by FIGS. 4A and 4B.
Figure 6:
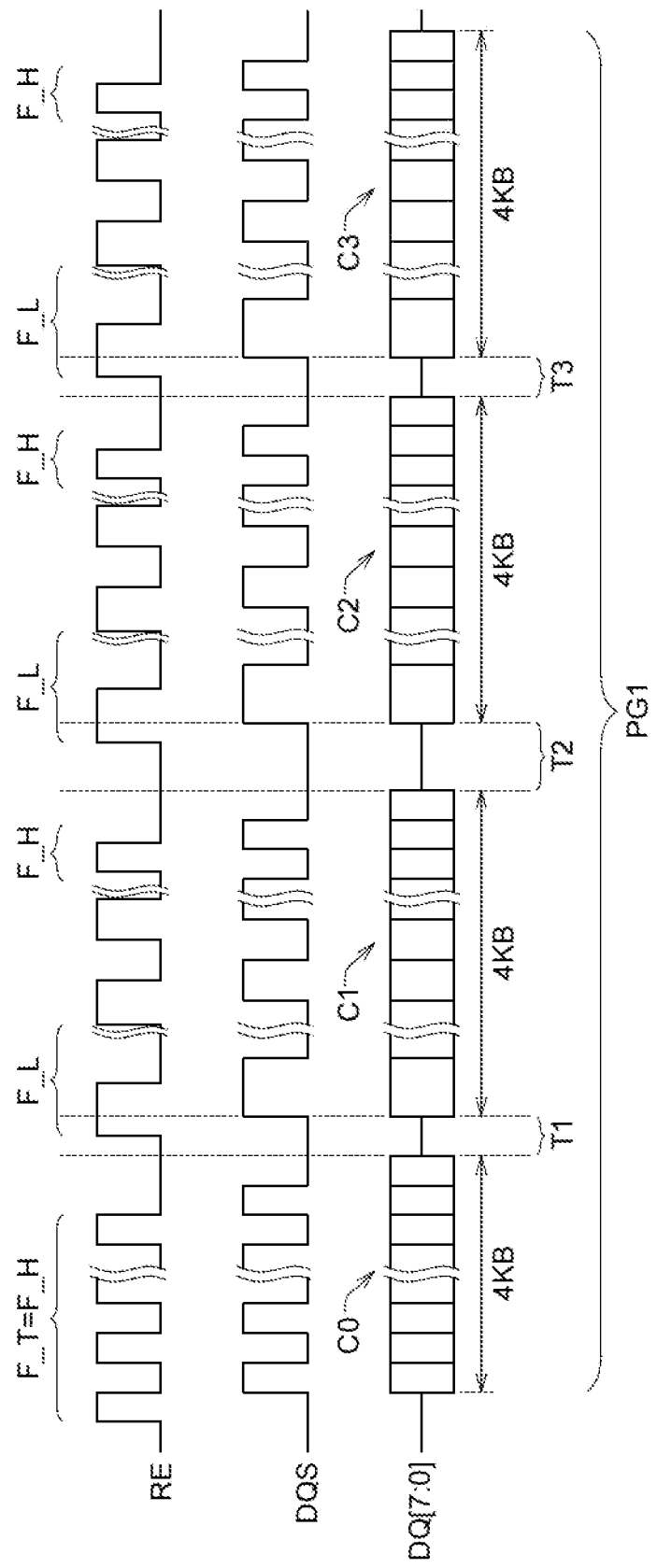

FIGS. 4A and 4B are flow diagrams of the control method for the reading operation of the memory device according to an embodiment of the present disclosure. FIGS. 5 and 6 are schematic diagrams of the reading operation of a page, which is performed according to the method shown by FIGS. 4A and 4B. Please refer to FIG. 4A firstly (and refer to FIGS. 5 and 6 in conjunction), the control method of the reading operation of the memory device 2000 begins at step S400: the memory device controller 1000 controls the memory device 2000 to execute the reading operation of the first chunk C0 of the page. The reading operation of chunk C0 is performed based on the toggle signal RE of a target toggle frequency F_T which is predefined. The target toggle frequency F_T is, e.g., the higher toggle frequency F_H.

Then, in step S402, the memory device controller 1000 determines whether the reading operation of chunk C0 is still being executed. If the reading operation of chunk C0 is still being executed, step S404 is executed: the toggle signal generator 200 maintains the toggle signal RE at the target toggle frequency F_T, and continuously provides the toggle signal RE to the memory device 2000. Then, returning to step S402.

If the reading operation of chunk C0 is completed, step S406 is executed: the toggle signal generator 200 determines whether necessary to temporarily stop providing the toggle signal RE to the memory device 2000. In determining at step S406 not stop providing the toggle signal RE, returning to step S404: the toggle signal RE is continuously provided to the memory device 2000 to perform the reading operation of the next chunk C1 (the toggle signal RE is maintained at the target toggle frequency F_T), as shown in FIG. 5.

If the internal storage space of the memory device controller 1000 is insufficient, or the memory device controller 1000 must perform other internal operations, the toggle signal generator 200 temporarily stops providing the toggle signal RE to the memory device 2000. The period for the toggle signal RE to be suspended, is e.g., the stop-period T1 in FIG. 6. Then, step S408 is executed.

In step S408, after the stop-period T1 has elapsed, the reading operation of the next chunk C1 is to be performed. Therefore, the toggle signal generator 200 sets the toggle signal RE as a proper toggle frequency F and provides it to the memory device 2000. In one example, if the stop-period T1 is shorter than the predefined period specified by the memory device 2000, the data signal DQ and the data strobe signal DQS may not be in the stable state at the early stage of the reading operation of the chunk C1. Hence, the toggle signal RE is set as the lower toggle frequency F_L, as shown in FIG. 6.

Next, referring to FIG. 4B, in step S410, the eye monitor 100 receives the data signal DQ and the data strobe signal DQS from the memory device 2000, and the eye monitor 100 analyzes the stability (i.e., the stability may be expressed by the stable state) of the data signal DQ and the data strobe signal DQS. Then, in step S412, the data amount included in the data signal DQ is counted. Then, in step S414, the eye monitor 100 analyzes the relationship of locations between the rising edge rs0 of the data strobe signal DQS, the left check-points cl1, cl2 and cl3 and the right check-points cr1, cr2 and cr3, so as to determine whether the latch margin of the data strobe signal DQS with respect to the data signal DQ is sufficient. If it is determined that the latch margin is insufficient, step S418 is executed: the toggle frequency F of the toggle signal RE remains unchanged (i.e., maintained at the lower toggle frequency F_L). Then, returning to step S410.

If it is determined in step S414 that the latch margin is sufficient, step S416 is executed: determining whether the toggle frequency is equal to the target toggle frequency F_T. If the toggle frequency is not equal to the target toggle frequency F_T, step S420 is executed: appropriately increasing the toggle frequency. For example, in the example of FIG. 2A, when the rising edge rs0 of the data strobe signal DQS is far away from the left check-point cl3 of the boundary, it means that the latch margin is sufficient and the incremental amount ΔF1 of the toggle frequency F is larger. Alternatively, in the example of FIG. 2B, when the rising edge rs0 of the data strobe signal DQS is closer to the left check-point cl3 of the boundary (e.g., the rising edge rs0 is substantially located at the left check-point cl2 and hence has a less distance from the left check-point cl3 of the boundary), the latch margin is still sufficient (i.e., the latch margin is still within a tolerant range). Therefore, the toggle frequency F of the toggle signal RE may still be increased. However, since the rising edge rs0 has a less distance from the left check-point cl3 of the boundary than the example of FIG. 2A, the toggle frequency F has an incremental amount ΔF2 less than the incremental amount ΔF1 in the example of FIG. 2A. Then, returning to step S410.

If it is determined in step S416 that the toggle frequency F is equal to the target toggle frequency F_T, then step S422 is executed: continuously performing the reading operation of the chunk C1, until all data (data amount of 4 KB) included in the chunk C1 are read completely.

Then, in step S424, the memory device controller 1000 determines whether the reading operation of the last chunk C3 of the page is completed. If the reading operation of chunk C3 is not completed, step S402 is executed. If the reading operation of chunk C3 is completed, the reading operation of the entire page is completed.

Based on the above steps, the control method for the reading operation of the memory device of the present disclosure is summarized as follows. The toggle signal generator 200 provides the toggle signal RE to the memory device 2000, and the toggle signal RE has a toggle frequency F. The memory device controller 1000 performs the reading operation of a page (e.g., page PG1) of the memory device 2000 according to the toggle signal RE. Page PG1 includes, e.g., four chunks C0-C3. The toggle signal generator 200 sets the toggle frequency F as the target toggle frequency F_T, and the target toggle frequency F_T is, e.g., the higher toggle frequency F_H. Furthermore, the memory device controller 1000 performs a reading operation of the first chunk C0 of the page PG1 according to the target toggle frequency F_T, so as to receive the data signal DQ of the memory device 2000. After the reading operation of the first chunk C0 is completed, the toggle frequency F is selectively adjusted to execute reading operation of chunk C1 after the first chunk C0 (chunk C1 may be referred to as "the second chunk"). The eye monitor 100 analyzes the stable state of the data signal DQ and the data strobe signal DQS, and the toggle signal generator 200 adjusts the toggle frequency F according to the stable state of the data signal DQ and the data strobe signal DQS.

In one example, the eye monitor 100 analyzes the latch margin of the data strobe signal DQS with respect to data signal DQ, based on a time difference between the rising edge rs0 of the data strobe signal DQS and at least one of the left check-points cl1, cl2 and cl3 (or the right check-points cr1, cr2 and cr3), so as to determine the stable state of the data signal DQ and the data strobe signal DQS.

The latch margin is related to the setup time of the data signal DQ with respect to the rising edge rs0 of the data strobe signal DQS. Alternatively, the latch margin is related to the hold time of the data signal DQ with respect to the rising edge rs0 of the data strobe signal DQS.

After the reading operation of the first chunk C0 is completed, the toggle signal generator 200 selectively stops providing the toggle signal RE to the memory device 2000. When the toggle signal generator 200 does not stop providing the toggle signal RE, the toggle frequency F is maintained as the target toggle frequency F_T to perform the reading operation of the second chunk C1.

On the other hand, when the reading operation of the first chunk C0 is completed, and the toggle signal generator 200 stops providing the toggle signal RE during the stop-period between the first chunk C0 and the second chunk C1, the toggle signal generator 200 adjusts the toggle frequency F as a first toggle frequency to perform the reading operation of the second chunk C1. The stop-period T1 of the example in FIG. 6 is less than the predefined period specified by the memory device 2000, hence, at early stage of the reading operation of the second chunk C1, data signal DQ and the data strobe signal DQS may not be in the stable state. Therefore, the first toggle frequency is set as less than the target toggle frequency F_T (e.g., the first toggle frequency is the lower toggle frequency F_L).

Furthermore, in the example of FIG. 6, the first toggle frequency is less than the target toggle frequency F_T. During the reading operation of the second chunk C1, the toggle frequency F may be increased based on the stable state of the data signal DQ and the data strobe signal DQS. For example, when the rising edge rs0 of the data strobe signal DQS is far from the left check-point cl3 of the boundary, the toggle frequency F is increased according to the larger incremental amount ΔF1. Alternatively, when the rising edge rs0 of the data strobe signal DQS is close to the left check-point cl3 of the boundary, the toggle frequency F is increased according to the less incremental amount ΔF2.

Figure 7:
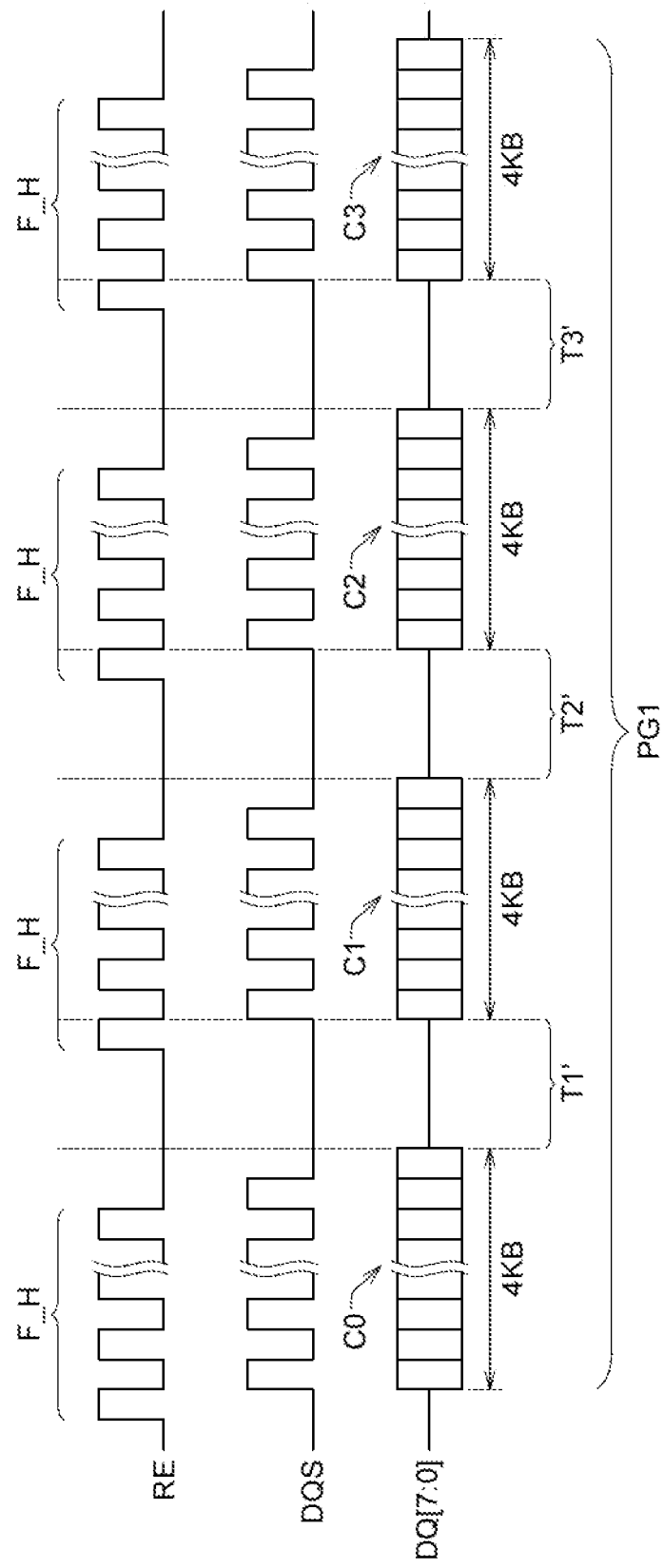
FIG. 7 is a schematic diagram illustrating another example of reading operation of the page.

On the other hand, please refer to FIG. 7, which is a schematic diagram illustrating another example of reading operation of the page. In the example of FIG. 7, if the stop-period T1' between the first chunk C0 and the second chunk C1 is greater than or equal to the predefined period specified by the memory device 2000 (e.g., 1 μs), at early stage of the reading operation of the second chunk C1 the data signal DQ and data strobe signal DQS are already in the stable state, hence, the first toggle frequency is equal to the target toggle frequency F_T (i.e., the toggle frequency F may be maintained at the target toggle frequency F_T). Compared with the example in FIG. 7, the stop-period T1 in the example in FIG. 6 is shorter (shorter than the stop-period T1' in FIG. 7), which means that there is a shorter waiting time between the first chunk C0 and the second chunk C1. Hence, the overall time required for the reading operation of the page PG1 is shorter, which may improve efficiency of the reading operation.

It will be apparent to those skilled in the art that various modifications and variations can be made to the disclosed embodiments. It is intended that the specification and examples be considered as exemplars only, with a true scope of the disclosure being indicated by the following claims and their equivalents.

What is claimed is:

1. A control method, for controlling a reading operation of a memory device, the control method comprising:
providing a toggle signal to the memory device, the toggle signal has a toggle frequency;
performing a reading operation of a page of the memory device according to the toggle signal, wherein the page includes a plurality of chunks;
setting the toggle frequency as a target toggle frequency, and performing a reading operation of a first chunk of the page according to the target toggle frequency, so as to receive a data signal from the memory device; and
after the reading operation of the first chunk is completed, selectively adjusting the toggle frequency to perform a reading operation of a second chunk after the first chunk according to a stable state of the data signal and a data strobe signal.

2. The control method according to claim 1, wherein a latch margin of the data strobe signal with respect to the data signal is analyzed according to a time difference between at least one check-point and a rising edge of the data strobe signal, so as to determine the stable state of the data signal and the data strobe signal.

3. The control method according to claim 2, wherein the latch margin is related to a setup time of the data signal with respect to the rising edge of the data strobe signal.

4. The control method according to claim 2, wherein the latch margin is related to a hold time of the data signal with respect to the rising edge of the data strobe signal.

5. The control method according to claim 1, wherein after the reading operation of the first chunk is completed, selectively stopping providing the toggle signal to the memory device, in determining not to stop providing the toggle signal, maintaining the toggle frequency as the target toggle frequency to perform the reading operation of the second chunk.

6. The control method according to claim 5, wherein in determining to stop providing the toggle signal during a stop-period after the reading operation of the first chunk is completed, adjusting the toggle frequency as a first toggle frequency to perform the reading operation of the second chunk.

7. The control method according to claim 6, wherein in determining that the stop-period is greater than or equal to a predefined period, the first toggle frequency is equal to the target toggle frequency.

8. The control method according to claim 6, wherein in determining that the stop-period is less than a predefined period, the first toggle frequency is less than the target toggle frequency.

9. The control method according to claim 8, wherein in determining that the first toggle frequency is less than the target toggle frequency, during the reading operation of the second chunk, the toggle frequency is increased according to the stable state of the data signal and the data strobe signal.

10. The control method according to claim 9, wherein an incremental amount of the toggle frequency is determined according to a distance between a rising edge of the data strobe signal and a boundary check-point.

11. A control method, for controlling a reading operation of a memory device, the control method comprising:
provide a toggle signal to the memory device, the toggle signal has a toggle frequency;
performing a reading operation of a page of the memory device according to the toggle signal, wherein the page includes a plurality of chunks;
setting the toggle frequency as a target toggle frequency, and performing a reading operation of a first chunk of the page according to the target toggle frequency, so as to receive a data signal from the memory device;
after the reading operation of the first chunk is completed, analyzing a latch margin of the data strobe signal with respect to the data signal according to a time difference between at least one check-point and a rising edge of the data strobe signal;
determining a stable state of the data signal and the data strobe signal according to the latch margin;
selectively adjusting the toggle frequency according to the stable state of the data signal and the data strobe signal; and
performing a reading operation of a second chunk after the first chunk according to the toggle frequency which is adjusted.

12. The control method according to claim 11, wherein after the reading operation of the first chunk is completed, selectively stopping providing the toggle signal to the memory device, in determining not to stop providing the toggle signal, maintaining the toggle frequency as the target toggle frequency to perform the reading operation of the second chunk.

13. The control method according to claim 12, wherein in determining to stop providing the toggle signal during a stop-period after the reading operation of the first chunk is completed, adjusting the toggle frequency as a first toggle frequency to perform the reading operation of the second chunk.

14. The control method according to claim 13, wherein the first toggle frequency is set as equal to or less than the target toggle frequency according to a relationship between the stop-period and a predefined period.

15. The control method according to claim 14, wherein in determining that the first toggle frequency is set as less than the target toggle frequency, during the reading operation of the second chunk, the toggle frequency is increased according to the stable state of the data signal and the data strobe signal.

16. A control method, for controlling a reading operation of a memory device, the control method comprising:
providing a toggle signal to the memory device, the toggle signal has a toggle frequency;
performing a reading operation of a page of the memory device according to the toggle signal, wherein the page includes a plurality of chunks;
setting the toggle frequency as a target toggle frequency, and performing a reading operation of a first chunk of the page according to the target toggle frequency, so as to receive a data signal from the memory device;
after the reading operation of the first chunk is completed, selectively stopping providing the toggle signal to the memory device and analyzing a latch margin of the data strobe signal with respect to the data signal;
selectively adjusting the toggle frequency according to the latch margin; and
performing a reading operation of a second chunk after the first chunk according to the toggle frequency which is adjusted.

17. The control method according to claim 16, wherein the latch margin is analyzed according to a time difference between at least one check-point and a rising edge of the data strobe signal.

18. The control method according to claim 17, wherein the latch margin is related to a setup time or a hold time of the data signal with respect to the rising edge of the data strobe signal.

19. The control method according to claim 17, wherein in the step of selectively adjusting the toggle frequency according to the latch margin comprising:
determining a stable state of the data signal and the data strobe signal according to the latch margin; and
in determining that the data signal and the data strobe signal are not in the stable state, the toggle signal has a first toggle frequency less than the target toggle frequency, in determining that the data signal and the data strobe signal are in the stable state, the toggle frequency is increased.

20. The control method according to claim 19, wherein in determining that the toggle signal is stopped providing to the memory device during a stop-period between the first chunk and a second chunk, the first toggle frequency is set as equal to or less than the target toggle frequency according to a relationship between the stop-period and a predefined period.

* * * * *